US012813001B2

(12) United States Patent
Yoshida et al.

(10) Patent No.: US 12,813,001 B2
(45) Date of Patent: Nov. 24, 2026

(54) PHOTOELECTRIC CONVERSION APPARATUS, PHOTOELECTRIC CONVERSION SYSTEM, AND MOVABLE BODY

(71) Applicant: CANON KABUSHIKI KAISHA, Tokyo (JP)

(72) Inventors: Ryo Yoshida, Tokyo (JP); Hiroshi Ikakura, Kanagawa (JP); Sho Suzuki, Tokyo (JP); Kenji Togo, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 350 days.

(21) Appl. No.: 18/603,032

(22) Filed: Mar. 12, 2024

(65) Prior Publication Data

US 2024/0313025 A1 Sep. 19, 2024

(30) Foreign Application Priority Data

Mar. 14, 2023 (JP) ................................ 2023-040176
Dec. 18, 2023 (JP) ................................ 2023-212823

(51) Int. Cl.
*H10F 39/00* (2025.01)
*H10W 80/00* (2026.01)
*H10W 90/00* (2026.01)

(52) U.S. Cl.
CPC ......... *H10F 39/809* (2025.01); *H10F 39/018* (2025.01); *H10F 39/811* (2025.01); *H10W 80/312* (2026.01); *H10W 80/327* (2026.01); *H10W 80/754* (2026.01); *H10W 90/792* (2026.01)

(58) Field of Classification Search
CPC ....... H10F 39/809; H10F 39/18; H10F 39/811
See application file for complete search history.

(56) References Cited

U.S. PATENT DOCUMENTS

2015/0076649 A1 3/2015 Kim
2020/0091218 A1 3/2020 Ikakura
2022/0059597 A1 2/2022 Tange

FOREIGN PATENT DOCUMENTS

JP 2013033786 A 2/2013
KR 20110107747 A 10/2011
KR 20210141935 A 11/2021
KR 20220028008 A 3/2022
KR 20220064085 A 5/2022
TW 201304064 A 1/2013
TW 202044333 A 12/2020

*Primary Examiner* — Suberr L Chi
(74) *Attorney, Agent, or Firm* — Canon U.S.A., Inc. IP Division

(57) ABSTRACT

In a stack type photoelectric conversion apparatus in which a first substrate and a second substrate are bonded with junction electrodes disposed on the respective substrates, a first silicon nitride film disposed on the first substrate and a second silicon nitride film disposed on the second substrate differ in compression stress.

19 Claims, 10 Drawing Sheets

FIG.6

| | RF Power | $SiH_4$ FLOW RATE | $NH_3$ FLOW RATE | PRESSURE |
|---|---|---|---|---|
| FIRST SILICON NITRIDE FILM | 1 | 1 | 1 | 1 |
| SECOND SILICON NITRIDE FILM | 1.02 – 1.07 | 0.77 – 0.95 | 0.76 – 0.94 | 0.83 – 0.96 |

PHOTOELECTRIC CONVERSION APPARATUS, PHOTOELECTRIC CONVERSION SYSTEM, AND MOVABLE BODY

BACKGROUND

Technical Field

One disclosed aspect of the embodiments relates to a photoelectric conversion apparatus, a photoelectric conversion system, and a movable body.

Description of the Related Art

A stack type photoelectric conversion apparatus is manufactured by separately forming a photodiode substrate on which a light receiving element is formed, and a circuit substrate on which a signal processing circuit is formed, and bonding the photodiode substrate and the circuit substrate. As discussed in Japanese Patent Application Laid-Open No. 2013-33786, a stack type photoelectric conversion apparatus that employs Cu—Cu connection has been known. In the Cu—Cu connection type photoelectric conversion apparatus, Cu connection terminals are formed at bonded interfaces of substrates, and the substrates are electrically connected by bonding the substrates in such a manner that the Cu connection terminals overlap each other.

As photoelectric conversion apparatuses become complex, the number of wiring layers formed on a substrate tends to increase. This influence increases the warpage of substrates. With a large warp in a substrate, a defect, such as void generation or misalignment, can occur when substrates are bonded.

To prevent a defect from occurring when substrates of a stack type photoelectric conversion apparatus are bonded, it is desirable that the warpage of at least one of a plurality of substrates to be bonded by Cu—Cu connection be small. Nevertheless, a configuration of reducing warpage is not considered in Japanese Patent Application Laid-Open No. 2013-33786.

SUMMARY

The present disclosure provides a technique that can reduce the warpage of at least one of substrates in a Cu—Cu connection type photoelectric conversion apparatus. According to an aspect of the embodiments, a photoelectric conversion apparatus includes a first substrate and a second substrate. A first wiring structure, a first silicon nitride film, a first insulating layer, and a first junction electrode are disposed between the first substrate and the second substrate. A bottom portion of the first junction electrode and a wiring layer closest to the bottom portion of the first junction electrode among wiring layers included in the first wiring structure are electrically connected with a first junction via. A second wiring structure, a second silicon nitride film, a second insulating layer, and a second junction electrode are disposed between the first junction electrode and the second substrate. A bottom portion of the second junction electrode and a wiring layer closest to the bottom portion of the second junction electrode among wiring layers included in the second wiring structure are electrically connected with a second junction via. The first junction electrode and the second junction electrode are bonded, and the first insulating layer and the second insulating layer are bonded on the bonded surface. The first silicon nitride film is disposed between the first wiring structure and the bonded surface, the second silicon nitride film is disposed between the second wiring structure and the bonded surface, and the first silicon nitride film and the second silicon nitride film differ in compression stress.

Further features of the embodiments will become apparent from the following description of exemplary embodiments with reference to the attached drawings.

BRIEF DESCRIPTION OF THE DRAWINGS

FIG. 6 is a table illustrating a manufacturing method for the photoelectric conversion apparatus according to the first exemplary embodiment.

DESCRIPTION OF THE EMBODIMENTS

Figure 1:
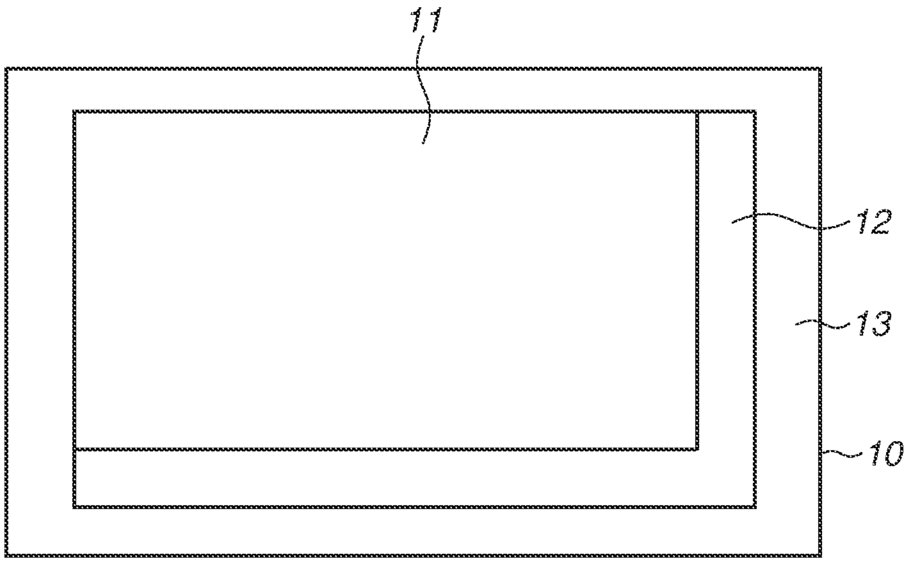
FIG. 1 is a schematic diagram illustrating a photoelectric conversion apparatus according to a first exemplary embodiment.

Hereinafter, exemplary embodiments of the present disclosure will be described with reference to the accompanying drawings. In the following description and drawings, components common to a plurality of drawing are denoted by common reference numerals. Thus, the common components will be described with cross-reference to the plurality of drawings, and the description of the components denoted by the common reference numerals will be appropriately omitted.

In each exemplary embodiment to be described below, an imaging apparatus will be mainly described as an example of a photoelectric conversion apparatus. Nevertheless, the photoelectric conversion apparatus according to each exemplary embodiment is not limited to the imaging apparatus. Each exemplary embodiment can also be applied to other examples of the photoelectric conversion apparatus. Examples of the photoelectric conversion apparatus include a distance measurement apparatus (apparatus for focus detection or distance measurement that uses time of flight (TOF), etc.), and a photometric apparatus (apparatus for the measurement of an incident light amount, etc.).

A metal member, such as a wire and a pad, to be described in this specification may include a single metal substance of a certain one element, or may be a mixture (alloy). For example, a wire to be described as a copper wire may include a single copper substance, or may mainly contain copper and further another component or other components.

For example, a pad to be connected to an external terminal may include a single aluminum substance, or may mainly contain aluminum and further contain another component or other components.

The copper wire and the aluminum pad described above are examples, and can be changed to various types of metal. The wire and the pad described above are examples of metal members to be used in the photoelectric conversion apparatus, and other metal members can also be applied to a wire and a pad.

A first exemplary embodiment will be described with reference to FIGS. 1 to 3. FIG. 1 is a schematic diagram illustrating a back-illuminated photoelectric conversion apparatus 10 viewed from a normal direction of an illumination surface. The photoelectric conversion apparatus 10 includes a light receiving pixel region 11, a light shielded pixel region 12, and a peripheral region 13. In the light receiving pixel region 11 and the light shielded pixel region 12, unit pixels including photoelectric conversion elements are two-dimensionally arrayed on m rows and n columns.

Figure 2:
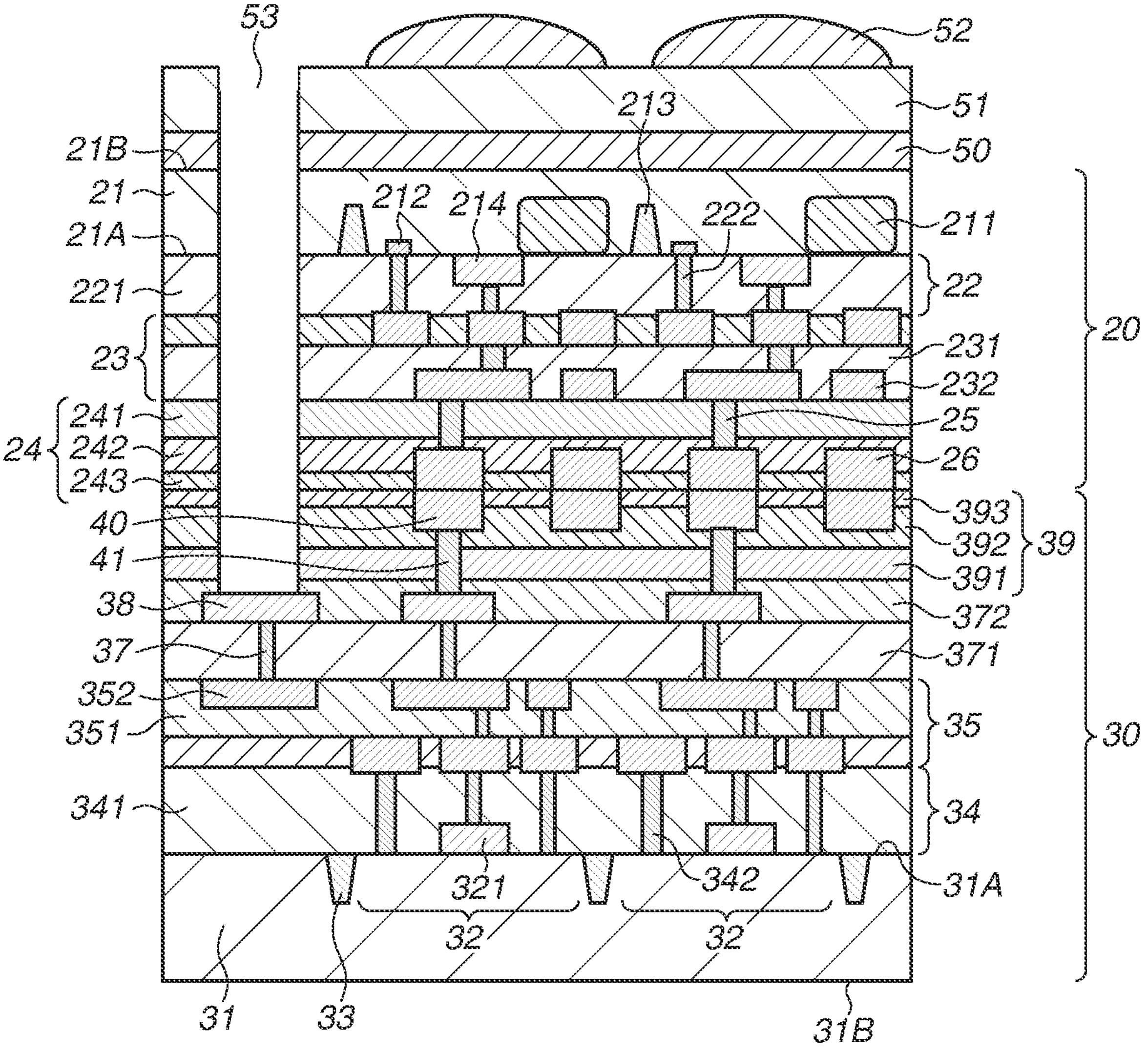
FIG. 2 is a schematic diagram illustrating the photoelectric conversion apparatus according to the first exemplary embodiment.

FIG. 2 is a cross-sectional schematic diagram of the photoelectric conversion apparatus 10. The photoelectric conversion apparatus 10 is formed by bonding a photodiode substrate 20 on which a light receiving element is formed, and a circuit substrate 30 on which a signal processing circuit is formed.

The photodiode substrate 20 includes a first semiconductor layer 21 having a first principal surface 21A and a second principal surface 21B. Elements, such as a plurality of photodiodes 211 and floating diffusions 212, are formed on the first principal surface 21A of the first semiconductor layer 21. In addition, element isolation regions 213 that isolate the photodiodes 211 are formed. The thickness of the first semiconductor layer 21 can typically fall within the range from 1 to 10 μm.

A first contact layer 22 is formed on the first principal surface 21A of the first semiconductor layer 21.

The first contact layer 22 includes a first insulating film 221 formed on the first principal surface 21A of the first semiconductor layer 21, and first contact plugs 222 formed inside the first insulating film 221. The first insulating film 221 is a pre-metal dielectric film, for example.

A first wiring structure 23 is formed on the first insulating film 221. The first wiring structure 23 includes a second insulating film 231, and a first conductor layer 232 formed inside the second insulating film 231. The material of the second insulating film 231 can be silicon oxide or silicon oxynitride, for example. The description will be given assuming that the second insulating film 231 is a silicon oxide film that uses a silicon oxide. The first wiring structure 23 includes a plurality of wiring layers. In FIG. 2, the first wiring structure 23 includes two layers, but the number of layers is not limited to this.

A first junction film 24 is formed on the first wiring structure 23. In the present exemplary embodiment, the first junction film 24 has a three-layer structure including a first silicon oxide film 241, a first silicon nitride film 242, and a second silicon oxide film 243. First junction vias 25 are formed inside the first junction film 24. The first junction vias 25 electrically connect the bottom portions of corresponding first junction electrodes 26, and a wire laid in a wiring layer closest to the first junction electrodes 26 among wiring layers included in the first wiring structure 23.

In the present exemplary embodiment, the first wiring structure 23 uses a silicon oxide film as an interlayer film. In a thin film, such as an interlayer film, either compression or tension stress is generated depending on the material to be used. Because a silicon oxide film is a film having compression stress, the first wiring structure 23 has compression stress as a whole. Thus, when the photodiode substrate 20 in which the first wiring structure 23 is formed is placed in such a manner that the first principal surface 21A is faced upward, the wafer warps protruding upward.

With a large warp in the wafer, when the photodiode substrate 20 and the circuit substrate 30 are bonded, in a bonded portion between the photodiode substrate 20 and the circuit substrate 30, a defect, such as a bonding failure or a bonding positional shift, can occur. It is therefore desirable that the compression stress in the first silicon nitride film 242 is small. It is more desirable that the first silicon nitride film 242 has tension stress. Compression or compressive stress and tension or tensive stress are two types of stress in structural elements. Stress represents the action of a force or moment on a structural element. If the force pushes the element, it results in a compressive stress. Compressive stresses therefore tend to squeeze the element. If the force pulls the element, it results in a tensive stress. Tensive stresses therefore tend to stretch the element.

It is known that the smaller the compression stress of a silicon nitride film, the higher the content density of silicon-hydrogen bond in the film. In addition, hydrogen released from the silicon nitride film is easily supplied to a silicon substrate and a gate insulating film interface. For this reason, the content density of hydrogen bond in the film is desirably high also from the aspect of the end of dangling bond of silicon at a photodiode interface.

The circuit substrate 30 includes a signal processing circuit for performing signal processing on signals output from pixels. A second semiconductor layer 31 has a first principal surface 31A, and a second principal surface 31B positioned opposite the first principal surface 31A. A plurality of transistors 32 and element isolation regions 33 that isolate the transistors 32 are formed on the first principal surface 31A of the second semiconductor layer 31. A second contact layer 34 is also formed on the first principal surface 31A of the second semiconductor layer 31.

The second contact layer 34 includes a second pre-metal dielectric film 341 formed on the first principal surface 31A of the second semiconductor layer 31, and second contact plugs 342 formed inside the second pre-metal dielectric film 341. A second wiring structure 35 is arranged on the second pre-metal dielectric film 341. The second wiring structure 35 includes a second interlayer insulating film 351, and a second conductor layer 352 formed inside the second interlayer insulating film 351.

To speed up signal readout, the circuit substrate 30 is demanded to be a low-latency circuit substrate. Thus, the second interlayer insulating film 351 is desirably a low-k film, such as a carbon-doped hydrogenated silicon oxide (SiOCH) film.

The second wiring structure 35 includes a plurality of wiring layers. In FIG. 2, the second wiring structure 35 consists of two layers, but the number of layers is not limited to this.

A first upper layer insulating film 371 and upper layer vias 37 formed inside the first upper layer insulating film 371, and a second upper layer insulating film 372 and upper layer wires 38 formed inside the second upper layer insulating film 372 are provided over the second wiring structure 35. A second junction interlayer film 39 is formed on the second upper layer insulating film 372.

In the present exemplary embodiment, the second junction interlayer film 39 has a three-layer structure including a third silicon oxide film 391, a second silicon nitride film 392, and a fourth silicon oxide film 393. Second junction vias 41 that electrically connect the bottom portions of corresponding second junction electrodes 40 and the upper layer wires 38 is formed inside the second junction interlayer film 39. The second junction electrodes 40 and the second junction vias 41 are made of copper.

Bonding to be performed is so-called hybrid bonding that bonds a metal wire portion and an insulating layer on a bonding surface (common bonding surface). In the present exemplary embodiment, the first junction electrodes 26 and the second junction electrodes 40 are bonded as a metal portion. In addition, the second silicon oxide film 243 serving as a first insulating layer, and the fourth silicon oxide film 393 serving as a second insulating layer are bonded. The insulating layer on the bonding surface is not limited to a silicon oxide film, and may be a silicon oxynitride (SiON) film, for example.

In the present exemplary embodiment, because the second wiring structure 35 includes a low-k film, the second wiring structure 35 has tension stress. Thus, when the circuit substrate 30 in which the second wiring structure 35 is formed is placed in such a manner that the first principal surface 31A is faced upward, the wafer warps protruding downward.

Even if the second wiring structure 35 does not include a low-k film, the warpage of the circuit substrate 30 can occur. To speed up signal processing and achieve higher functionality, the number of wiring layers of the second wiring structure 35 is desirably large. Generally, the number of wiring layers of the second wiring structure 35 on the circuit substrate 30 is larger than that of the first wiring structure 23 on the photodiode substrate 20. Thus, the warpage of the circuit substrate 30 that occurs after the second wiring structure 35 is formed can become greater than the warpage of the photodiode substrate 20 that occurs after the first wiring structure 23 is formed. Furthermore, when the second wiring structure 35 includes a low-k film, the warpage can become further greater.

In view of the foregoing, in the present exemplary embodiment, by making compression stress of the second silicon nitride film 392 larger than that of the first silicon nitride film 242, the downward protruding warpage of the wafer in the circuit substrate 30 is reduced.

Furthermore, to reduce the downward protruding warpage of the wafer in the circuit substrate 30, a film with a film thickness thicker than that of the first silicon nitride film 242 is used as the second silicon nitride film 392. The compression stress of the second silicon nitride film 392 can fall within the range from 400 MPa to 1200 MPa, for example. The film thickness of the second silicon nitride film 392 can fall within the range from 400 nm to 800 nm, inclusive.

The film thickness of the second silicon nitride film 392 is desirably thicker than that of the first silicon nitride film 242 by 150 nm or more. If the second silicon nitride film 392 is thinner than this, the amount of warpage reduction in the circuit substrate 30 is small, and it is impossible to sufficiently prevent a defect that can occur when the photodiode substrate 20 and the circuit substrate 30 are bonded. By making the film thickness of the second silicon nitride film 392 thicker than that of the first silicon nitride film 242 by 150 nm or more, it is possible to prevent a defect that can occur when the photodiode substrate 20 and the circuit substrate 30 are bonded.

On the other hand, if a film having high stress is used as an interlayer insulating film, there is concern that a stress-induced void (SIV) is generated. For example, with a large stress gradient in a wire, a void tends to be easily generated.

Figure 3:
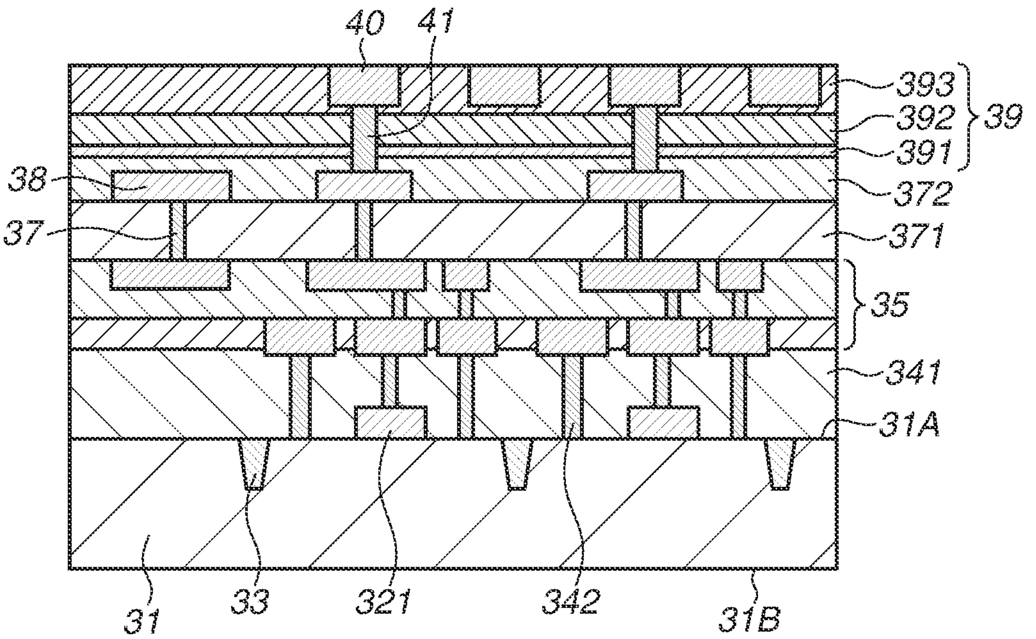
FIG. 3 is a schematic diagram illustrating the photoelectric conversion apparatus according to the first exemplary embodiment.

A configuration illustrated in FIG. 3 in which the second junction vias 41 penetrate through the second silicon nitride film 392 will be considered. Tension stress is generated by heat contraction in copper in the second junction electrodes 40 and the second junction vias 41. Due to a copper volume difference, stress in the second junction electrodes 40 is larger than that the one in the second junction vias 41. If the compression stress of the second silicon nitride film 392 is applied to the second junction vias 41 in this state, a stress gradient in the second junction electrodes 40 and the second junction vias 41 is amplified. This can worsen the SIV.

In view of the foregoing, in the present exemplary embodiment, as illustrated in FIG. 2, a structure in which the second junction electrodes 40 are formed inside the second silicon nitride film 392 is employed. This reduces an increase in stress gradient in the second junction vias 41 and the second junction electrodes 40 that is attributed to the compression stress of the second silicon nitride film 392. It is therefore possible to prevent the generation of the SIV.

In the present exemplary embodiment, as illustrated in FIG. 2, when the surfaces of the second junction electrodes 40 that contact the second junction vias 41 are regarded as the bottom surfaces, the distance from the first principal surface 31A to the bottom surfaces of the second junction electrodes 40 is longer than the distance from the first principal surface 31A to the surface of the second silicon nitride film 392 that is closer to the first principal surface 31A (lower surface in FIG. 2). The bottom surfaces of the second junction electrodes 40 contact the second silicon nitride film 392. This configuration can prevent hydrogen contained in the photodiode substrate 20 from being diffused to the circuit substrate 30 via the second junction electrodes 40, and thus, hydrogen supply to the photodiodes 211 is facilitated and dark current reduction can be achieved. From the aspect of the above-described dark current reduction, the distance from the bottom surfaces of the second junction electrodes 40 to the surface of the second silicon nitride film 392 that is closer to the first principal surface 31A (lower surface in FIG. 2) is preferably 50 nm to 600 nm, inclusive, and is more preferably 90 nm to 600 nm, inclusive.

A back surface insulating film 50, a color filter layer 51, and micro lenses 52 are formed on the second principal surface 21B of the first semiconductor layer 21. The back surface insulating film 50 can be an insulating film, such as a silicon oxide film, a silicon nitride film, or a silicon oxynitride film. An interlayer lens (not illustrated) may be provided inside the back surface insulating film 50.

A pad opening portion 53 is formed penetrating through the color filter layer 51, the back surface insulating film 50, the first semiconductor layer 21, the first contact layer 22, the first wiring structure 23, the first junction film 24, and the second junction interlayer film 39. A pad electrode as a part of one upper layer wire 38 is provided on the bottom surface of the pad opening portion 53. By forming a wire (not illustrated) on the pad electrode by wire bonding via the pad opening portion 53, electric connection to a package electrode (not illustrated) can be established.

Hereinafter, an example of a manufacturing method for the photoelectric conversion apparatus 10 according to the present exemplary embodiment will be described with reference to FIGS. 4A to 6.

Figure 4A:
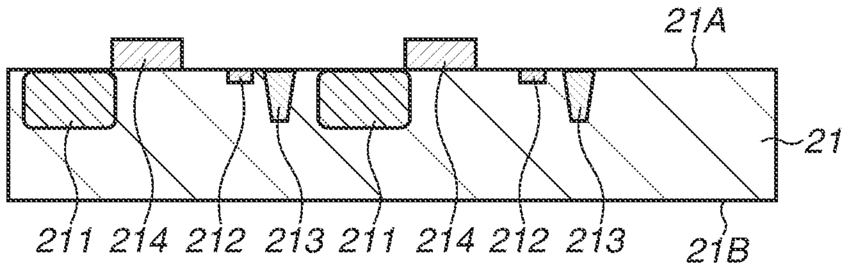
FIGS. 4A to 4D are schematic diagrams illustrating a manufacturing method for the photoelectric conversion apparatus according to the first exemplary embodiment.

First of all, a manufacturing method for the photodiode substrate 20 will be described. As illustrated in FIG. 4A, the photodiodes 211 and the floating diffusions 212 are formed inside the first semiconductor layer 21. The photodiodes 211 and the floating diffusions 212 are formed by an ion implantation method, for example.

The element isolation regions 213 are formed between the photodiodes 211. The element isolation regions 213 are formed by shallow trench isolation (STI) or local oxidization of silicon (LOCOS), for example. Gate electrodes 214 are formed on the first principal surface 21A of the first semiconductor layer 21 via a gate insulating film (not illustrated). The gate electrodes 214 can be made of polysilicon, for example.

Figure 4B:
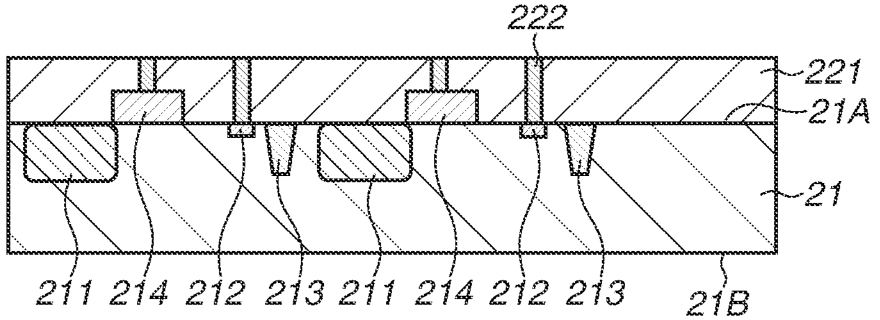

As illustrated in FIG. 4B, the first insulating film 221 and the first contact plugs 222 are formed. First of all, the first insulating film 221 is formed on the first principal surface 21A of the first semiconductor layer 21. The first insulating film 221 can be a silicon oxide film formed using a method, such as high-density plasma chemical vapor deposition (HDP-CVD).

Aside from the method, for example, a method for plasma-enhanced chemical vapor deposition (PECVD) may be used as a film formation method for the first insulating film 221. Alternatively, a method for sub-atmospheric chemical vapor deposition (SACVD) may be used. After that, by performing polishing by chemical mechanical polishing (CMP), the surface is planarized.

Next, by photolithography and etching, air gaps (via holes) for forming vias are formed inside the first insulating film 221. Subsequently, a conductor is buried inside the via holes using physical vapor deposition (PVD) or chemical vapor deposition (CVD). The conductor can have a multi-layered configuration including titanium, titanium nitride, and tungsten, for example. After that, the first contact plugs 222 are formed by removing the conductor on the first insulating film 221 by the CMP or etch back.

Figure 4C:
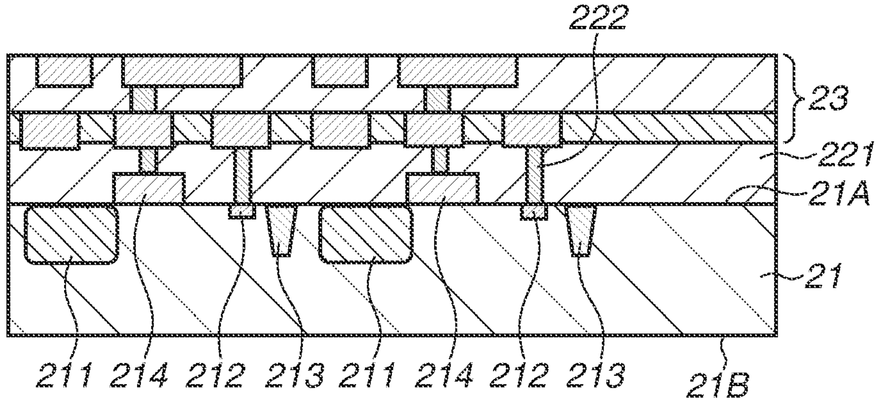

As illustrated in FIG. 4C, the first wiring structure 23 is formed on the first insulating film 221. An insulating film (for example, silicon oxide film) is formed using the PECVD or the like. Next, by photolithography, trenches or trenches and via holes are formed inside the insulating film, and a conductor (e.g., copper) is buried thereinside using a plating method or the like. Typically, through a dual damascene process, wires and via portions that are made of a copper conductor are formed. After that, the conductor on an insulator surface is removed by the CMP or the like. By repeating these processes, the first wiring structure 23 is formed.

Figure 4D:
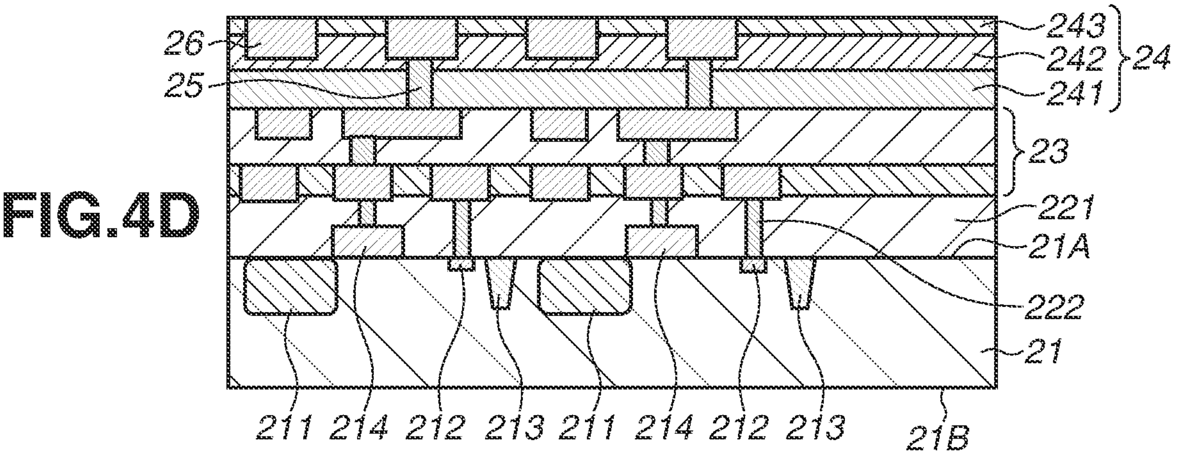

As illustrated in FIG. 4D, the first junction film 24 and the first junction electrodes 26 are formed over the first wiring structure 23. The first junction film 24 is formed by sequentially forming the first silicon oxide film 241, the first silicon nitride film 242, and the second silicon oxide film 243 using the PECVD or the like.

Next, using photolithography and etching, via holes for forming the first junction vias 25, and trenches for forming the first junction electrodes 26 are formed inside the first junction film 24. After that, using the plating method or the like, a conductor (e.g., copper) is buried inside the via hole and the trench, and the first junction vias 25 and the first junction electrodes 26 are formed by removing the conductor on the surface of the first junction film 24 by the CMP or the like. Typically, through the dual damascene process, a junction electrode and a via portion that are made of a copper conductor are formed.

Figures 5A, 5B, 5C, 5D, 5E:
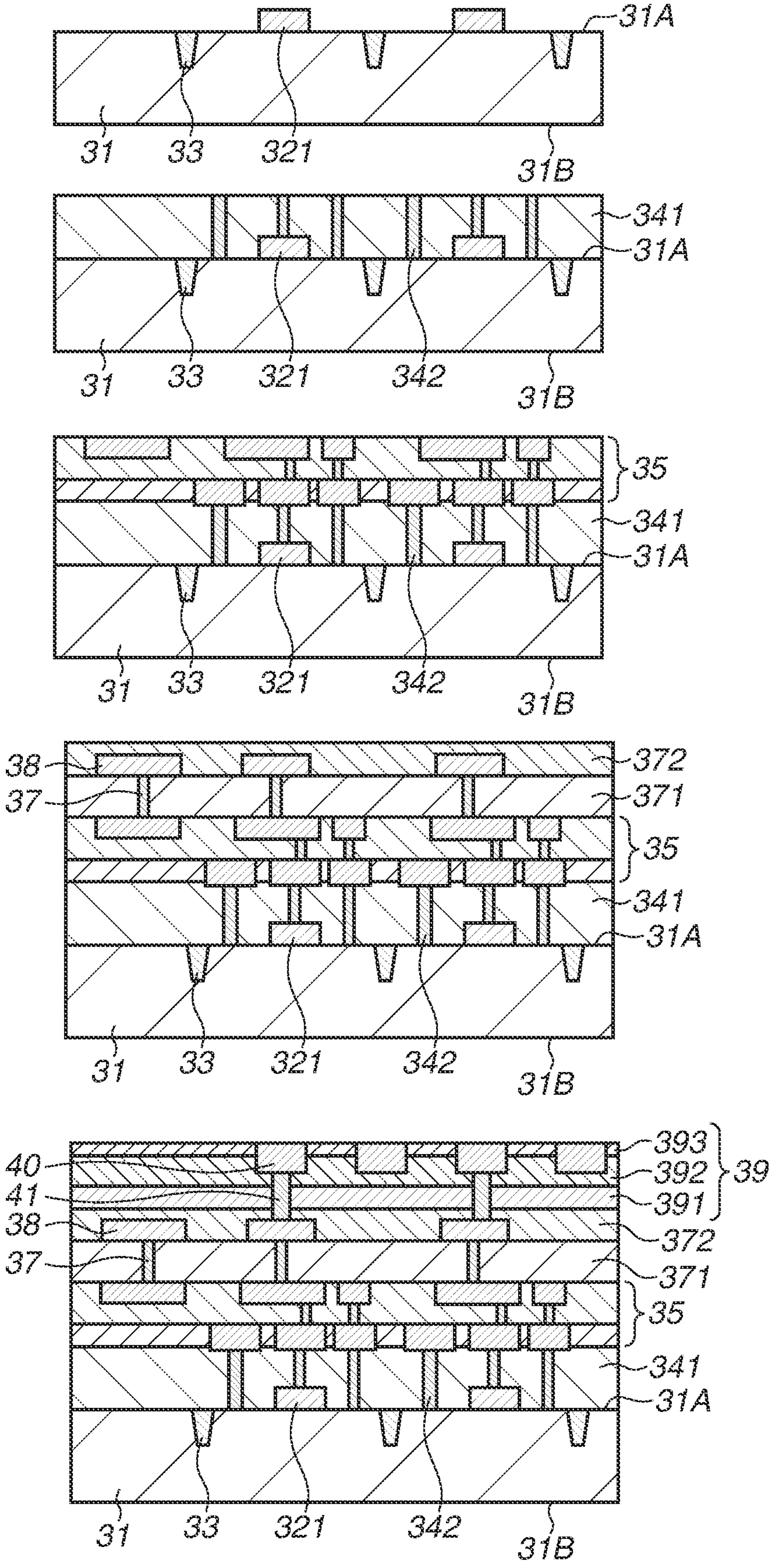
FIGS. 5A to 5E are schematic diagrams illustrating a manufacturing method for the photoelectric conversion apparatus according to the first exemplary embodiment.

Next, a manufacturing method for the circuit substrate 30 will be described. As illustrated in FIG. 5A, the element isolation regions 33 are formed inside the second semiconductor layer 31. The element isolation regions 33 are formed by the STI or the LOCOS, for example. In addition, diffusion layers (not illustrated), such as a source and a drain, are formed between the element isolation regions 33. These diffusion layers are formed by the ion implantation method, for example.

Gate electrodes 321 are formed on the first principal surface 31A of the second semiconductor layer 31 via a gate insulating film (not illustrated). The gate electrodes 321 are formed by forming a conductor (e.g., polysilicon) film using thermal CVD or the like and then performing patterning using photolithography.

As illustrated in FIG. 5B, the second pre-metal dielectric film 341 and the second contact plugs 342 are formed. First of all, the second pre-metal dielectric film 341 is formed on the first principal surface 31A of the second semiconductor layer 31. The second pre-metal dielectric film 341 can be a silicon oxide film formed using a method, such as the HDP-CVD, the PECVD, or the SACVD.

After that, by performing polishing by the CMP, the surface is planarized. Next, by photolithography and etching, air gaps (via holes) for forming vias are formed inside the second pre-metal dielectric film 341. Subsequently, a conductor is buried inside the via holes using the PVD or the CVD. The conductor can be tungsten, for example. After that, the second contact plugs 342 are formed by removing the conductor on the second pre-metal dielectric film 341 by the CMP, etch back, or the like.

As illustrated in FIG. 5C, the second wiring structure 35 is formed on the second pre-metal dielectric film 341. An insulating film (e.g., a low-k film, such as a SiOCH film) is formed using the PECVD or the like. Next, by photolithography, trenches or trenches and via holes are formed inside the insulating film, and a conductor (e.g., copper) is buried thereinside using the plating method or the like. After that, the conductor on an insulator surface is removed using the CMP or the like. By repeating these processes, the second wiring structure 35 is formed.

As illustrated in FIG. 5D, the upper layer vias 37 and the upper layer wires 38 are formed. First of all, the first upper layer insulating film 371 is formed using the PECVD or the like. Next, by photolithography, via holes are formed inside the first upper layer insulating film 371. Subsequently, a conductor is buried inside the via holes using the PVD or the CVD. The conductor can be tungsten or copper, for example.

After that, by removing the conductor on the first upper layer insulating film 371 using the CMP, etch back, or the like, the upper layer vias 37 are formed. The upper layer wires 38 including a pad electrode are formed by forming a conductor film, such as an aluminum film or the like, on the upper layer vias 37 using sputtering or the like, and then performing patterning of the conductor using photolithography. After the second upper layer insulating film 372 is formed on the upper layer wires 38 using the HDP-CVD, the PECVD, or the like, the surface is planarized using the CMP or the like.

As illustrated in FIG. 5E, the second junction interlayer film 39 and the second junction electrodes 40 are formed over the second upper layer insulating film 372. The second junction interlayer film 39 is formed by sequentially forming the third silicon oxide film 391, the second silicon nitride film 392, and the fourth silicon oxide film 393 using the PECVD or the like.

As described above, the second silicon nitride film 392 desirably has compression stress larger than that of the first silicon nitride film 242. A film having high compression stress can be formed by either or both increasing a film density or/and increasing a content density of Si—N bond in a silicon nitride film, for example. In the present exemplary embodiment, by adjusting film formation conditions for the second silicon nitride film 392 with respect to the first silicon nitride film 242 as illustrated in FIG. 6, a film having high compression stress is formed.

Next, using photolithography and etching, via holes for forming the second junction vias 41, and trenches for forming the second junction electrodes 40 are formed inside the second junction interlayer film 39. After that, using the plating method or the like, a conductor (e.g., copper) is buried inside the via holes and the trenches, and the second junction vias 41 and the second junction electrodes 40 are formed by removing the conductor on the surface of the second junction interlayer film 39 by the CMP or the like.

Figure 7A:
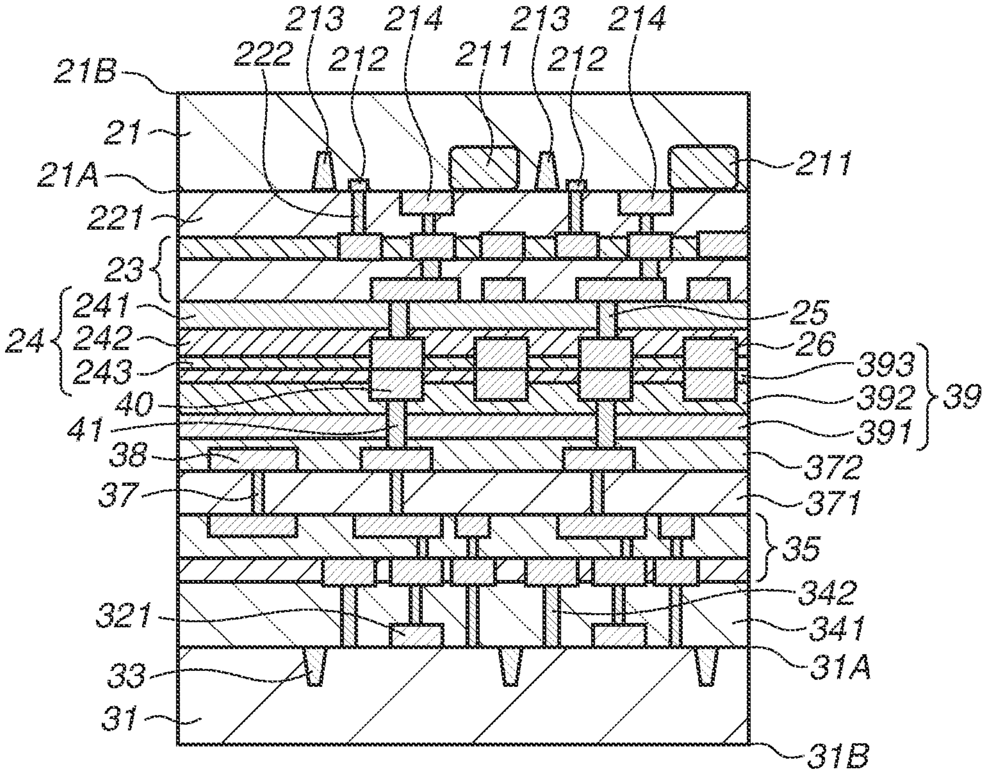
FIGS. 7A to 7C are schematic diagrams illustrating a manufacturing method for the photoelectric conversion apparatus according to the first exemplary embodiment.

As illustrated in FIG. 7A, the photodiode substrate 20 and the circuit substrate 30 manufactured through the above-described procedure are bonded using a hybrid bonding method. After the surfaces are activated by performing plasma processing on the photodiode substrate 20 and the circuit substrate 30, temporary bonding is performed in such a manner that the surface of the photodiode substrate 20 closer to the first principal surface 21A and the surface of the circuit substrate 30 closer to the first principal surface 31A overlap each other.

After that, by performing thermal treatment at about 350° C., for example, the photodiode substrate 20 and the circuit substrate 30 are bonded. At this time, it is desirable that the inverted photodiode substrate 20 and the circuit substrate 30 are close in warpage orientation and warpage degree to each other. In the present exemplary embodiment, by optimizing the stress and the film thickness of the second silicon nitride film 392, the warpage of the circuit substrate 30 is adjusted to be closer to the warpage of the photodiode substrate 20. This prevents the generation of a void and overlay misalignment that can occur when the photodiode substrate 20 and the circuit substrate 30 are bonded.

Subsequently, the first semiconductor layer 21 is thinned. For example, the first semiconductor layer 21 is thinned by sequentially performing processing in the order of back grinding, wet etching, and the CMP until the thickness of the first semiconductor layer 21 becomes a desired thickness.

Subsequently, a high-dielectric film (not illustrated) is formed on the surface of the first semiconductor layer 21 using atomic layer deposition (ALD), for example. The high-dielectric film can be made of a hafnium oxide or an aluminum oxide, for example. Next, an antireflection film (not illustrated) is formed using sputtering or the like. The antireflection film can be made of a tantalum oxide, for example.

Figure 7B:
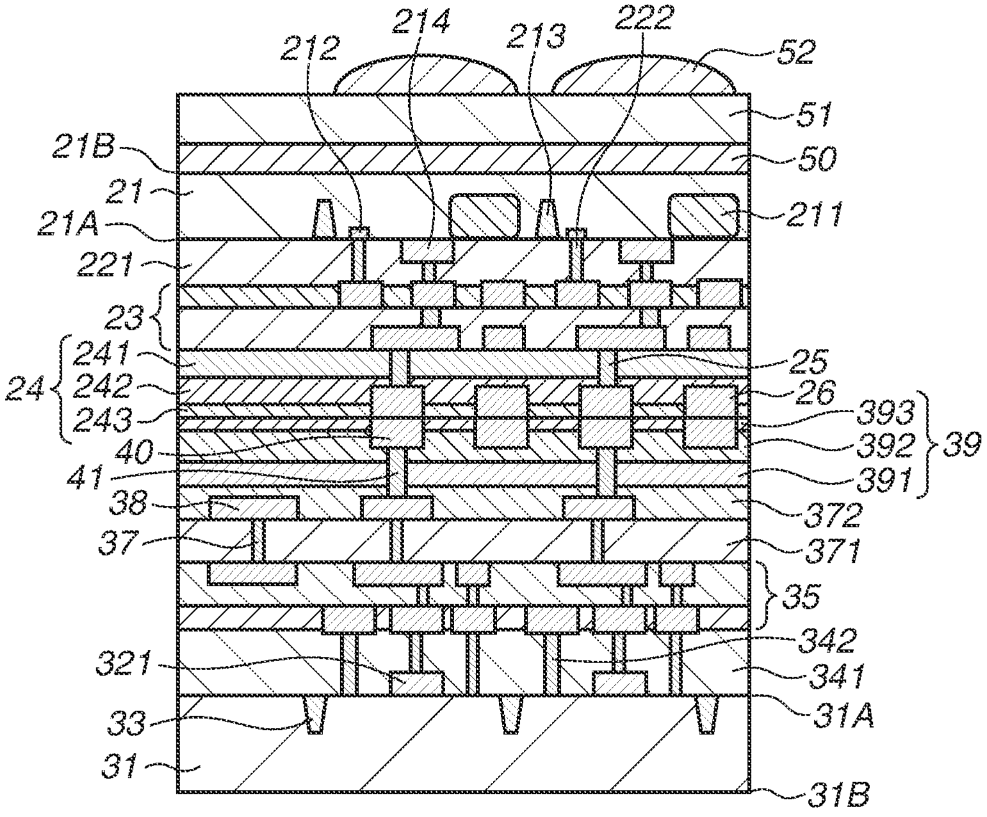

After that, as illustrated in FIG. 7B, the back surface insulating film 50 is formed using the PECVD or the like.

The back surface insulating film 50 is a silicon oxide film or a silicon nitride film, for example. The color filter layer 51 and the micro lenses 52 are sequentially formed over the back surface insulating film 50.

Figure 7C:
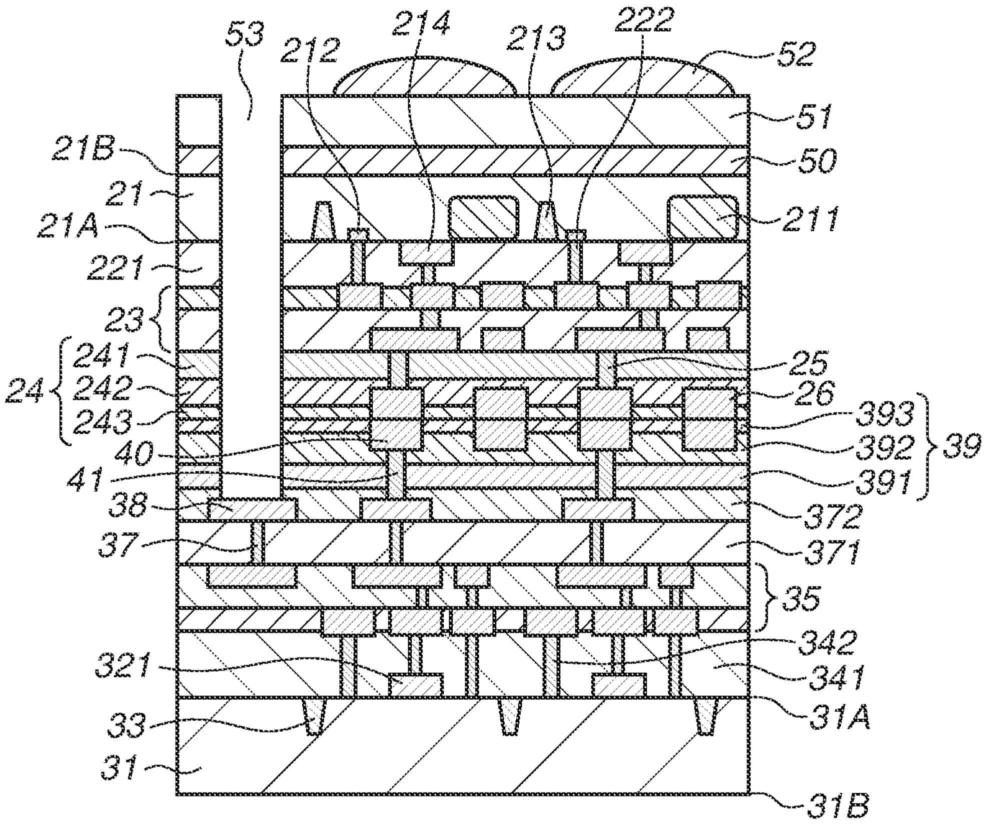

After that, as illustrated in FIG. 7C, the pad opening portion 53 is formed by performing dry etching in such a manner that at least part of the pad electrodes of the upper layer wires 38 is exposed.

Figure 8:
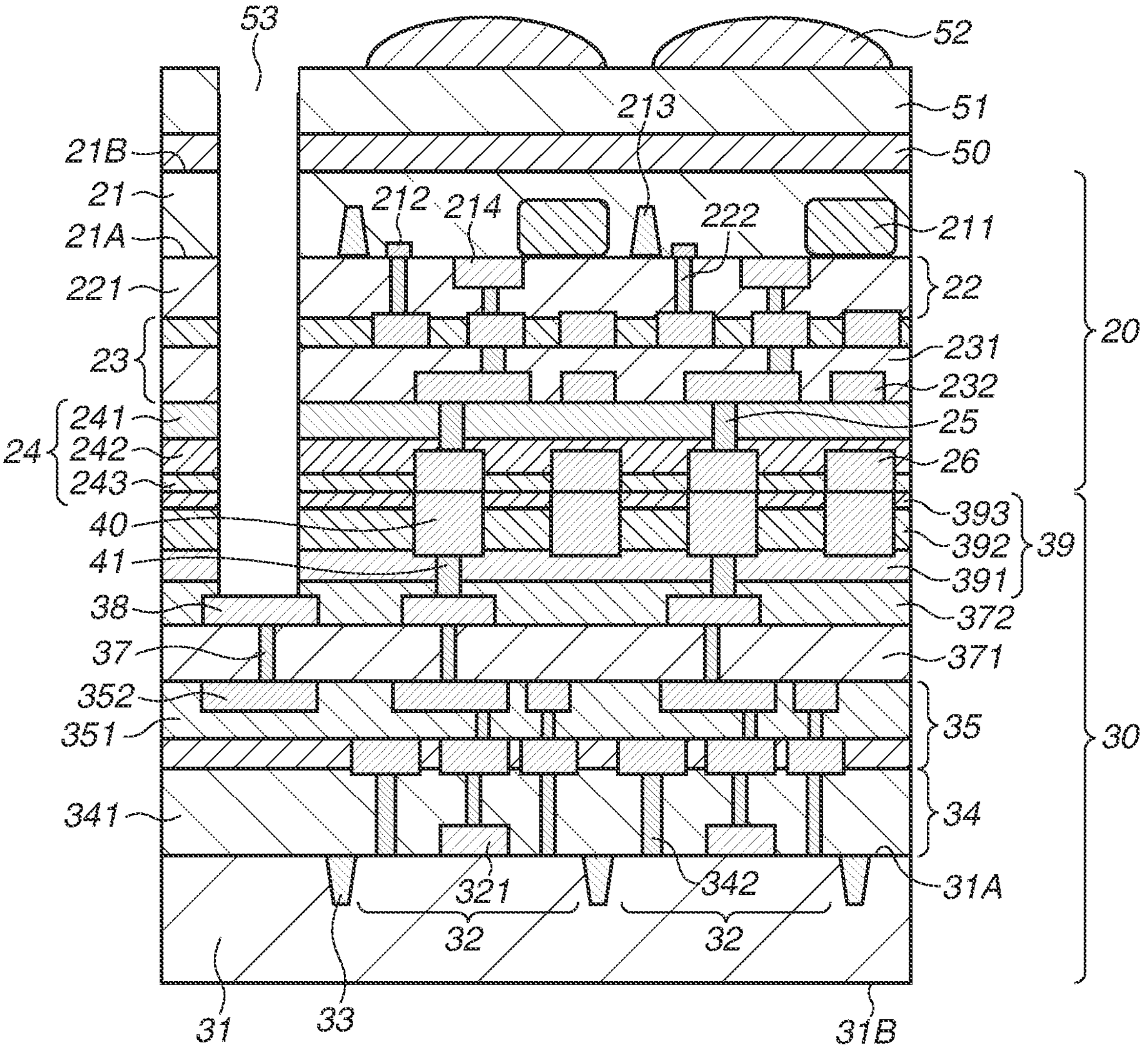
FIG. 8 is a schematic diagram illustrating a photoelectric conversion apparatus according to a second exemplary embodiment.

A second exemplary embodiment will be described with reference to FIG. 8. In the present exemplary embodiment, the second junction electrodes 40 penetrate through the second silicon nitride film 392. Here, the surfaces of the second junction electrodes 40 that contact the second junction vias 41 are regarded as bottom surfaces. As illustrated in FIG. 8, the distance from the first principal surface 31A to the surface of the second silicon nitride film 392 that is closer to the first principal surface 31A (lower surface in FIG. 8) is longer than the distance from the first principal surface 31A to the bottom surfaces of the second junction electrodes 40. The bottom surfaces of the second junction electrode 40 contact the third silicon oxide film 391.

When the surfaces connecting the bottom surfaces of the second junction electrodes 40 and the surface to be used in junction are regarded as side surfaces, as illustrated in FIG. 8, the side surfaces of the second junction electrodes 40 and the surface of the second silicon nitride film 392 that is closer to the first principal surface 31A (lower surface in FIG. 8) contact each other.

Although the first junction electrodes 26 do not penetrate through the first silicon nitride film 242 in FIG. 8, the first junction electrodes 26 may be formed to penetrate through the first silicon nitride film 242.

In this configuration, compression force applied by the second silicon nitride film 392 is not applied to the second junction vias 41. It is therefore possible to reduce a stress gradient in the second junction vias 41 and the second junction electrodes 40 more than that in the first exemplary embodiment, and it becomes possible to prevent the generation of an SIV.

Figure 9A:
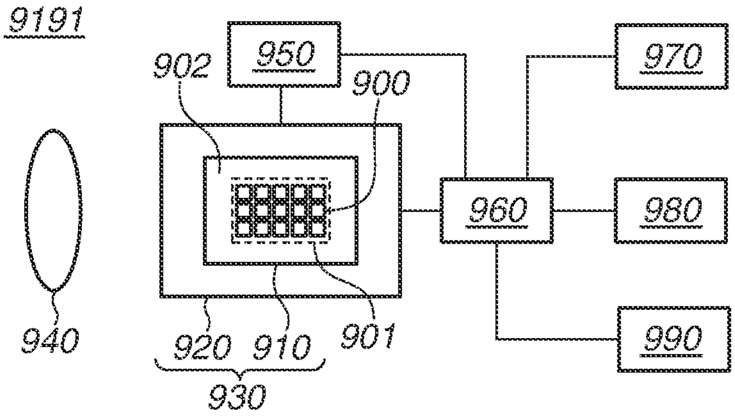
FIGS. 9A to 9C are diagrams illustrating an example of a device according to a third exemplary embodiment.

A third exemplary embodiment can be applied to both the first exemplary embodiment and the second exemplary embodiment. FIG. 9A is a schematic diagram illustrating a device 9191 including a semiconductor apparatus 930 according to the present exemplary embodiment. The photoelectric conversion apparatus according to each of the above-described exemplary embodiments can be used as the semiconductor apparatus 930.

The device 9191 including the semiconductor apparatus 930 will be described in detail. As described above, in addition to a semiconductor device 910 including the photoelectric conversion apparatus 10, the semiconductor apparatus 930 can include a package 920 that accommodates the semiconductor device 910. The package 920 can include a base member to which the semiconductor device 910 is fixed, and a lid member, such as glass, that faces the semiconductor device 910. The package 920 can further include a bonding member, such as a bonding wire or a bump, that connects a terminal provided on the base member and a corresponding terminal provided on the semiconductor device 910.

The device 9191 can include at least one of an optical device 940, a control device 950, a processing device 960, a display device 970, a storage device 980, and a mechanical device 990. The optical device 940 is compatible with the semiconductor apparatus 930. The optical device 940 is a lens, a shutter, or a mirror, for example. The control device 950 controls the semiconductor apparatus 930. The control device 950 is a semiconductor apparatus, such as an application specific integrated circuit (ASIC), for example.

The processing device 960 processes signals output from the semiconductor apparatus 930. The processing device 960 is a semiconductor apparatus, such as a central processing unit (CPU) or an ASIC for forming an analog front end (AFE) or a digital front end (DFE).

The display device 970 is an electroluminescence (EL) display device or a liquid crystal display device that displays information (image) obtained by the semiconductor apparatus 930. The storage device 980 is a magnetic device or a semiconductor device that stores information (image) obtained by the semiconductor apparatus 930. The storage device 980 is a volatile memory, such as a static random-access memory (SRAM) or a dynamic RAM (DRAM), or a nonvolatile memory, such as a flash memory or a hard disc drive.

The mechanical device 990 includes a moving portion or a drive unit, such as a motor or an engine. In the device 9191, a signal output from the semiconductor apparatus 930 is displayed on the display device 970, or transmitted to the outside by a communication device (not illustrated) included in the device 9191. For this reason, the device 9191 desirably further includes the storage device 980 and the processing device 960 aside from a storage circuit and an arithmetic circuit included in the semiconductor apparatus 930. The mechanical device 990 may be controlled based on signals output from the semiconductor apparatus 930.

The device 9191 is suitable for an electronic device, such as an information terminal (e.g., smartphone or wearable terminal) having an image capturing function, and a camera (e.g., interchangeable lens camera, compact camera, video camera, or monitoring camera). The mechanical device 990 in a camera can drive a component or components of the optical device 940 for zooming, focusing, or a shutter operation. Alternatively, the mechanical device 990 in a camera can move the semiconductor apparatus 930 for an antivibration operation.

The device 9191 can be a transport device, such as a vehicle, a vessel, or a flight vehicle. The mechanical device 990 in a transport device can be used as a moving device. The device 9191 serving as a transport device is suitable for a transport device that transports the semiconductor apparatus 930, and a transport device that assists and/or automatizes driving (steering) using an image capturing function.

The processing device 960 for assisting and/or automatizing driving (steering) can perform processing for manipulating the mechanical device 990 serving as a moving device, based on information obtained by the semiconductor apparatus 930. Alternatively, the device 9191 may be a medical device, such as an endoscope, a measuring device, such as a ranging sensor, an analytical device, such as an electronic microscope, an office device, such as a copier, and an industrial device, such as a robot.

According to the above-described exemplary embodiment, it is possible to obtain good pixel characteristics. The value of a semiconductor apparatus can be accordingly enhanced. The enhancement of value includes at least one of the addition of a function, performance upgrade, characteristic improvement, reliability improvement, an increase in manufacturing yield, a reduction in environment load, a cost reduction, downsizing, and weight reduction.

Consequently, using the semiconductor apparatus 930 according to the present exemplary embodiment in the device 9191 can also enhance the value of the device 9191. For example, the semiconductor apparatus 930 mounted on a transport device can achieve performance superior in performing image capturing of the outside of the transport device and the measurement of an external environment. Thus, to manufacture and sell a transport device, the determination to mount the semiconductor apparatus 930 according to the present exemplary embodiment on the transport device is advantageous to performance upgrade of the transport device. The semiconductor apparatus 930 is suitable especially for a transport device that performs drive assist and/or automatic operation of the transport device using information obtained by the semiconductor apparatus 930.

A photoelectric conversion system and a movable body according to the present exemplary embodiment will be described with reference to FIGS. 9B and 9C.

Figure 9B:
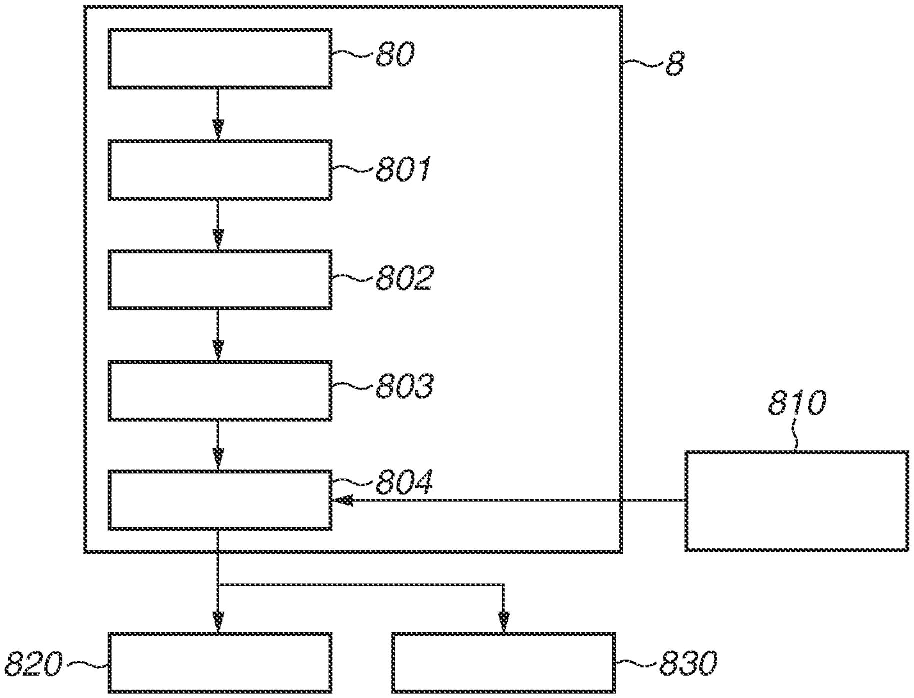

FIG. 9B illustrates an example of a photoelectric conversion system related to an in-vehicle camera. A photoelectric conversion system 8 includes a photoelectric conversion apparatus 80. The photoelectric conversion apparatus 80 is the photoelectric conversion apparatus described in any of the above-described exemplary embodiments.

The photoelectric conversion system 8 includes an image processing unit 801 that performs image processing on a plurality of pieces of image data acquired by the photoelectric conversion apparatus 80, and a parallax acquisition unit 802 that calculates a parallax (phase difference between parallax images) from a plurality of pieces of image data acquired by the photoelectric conversion system 8.

The photoelectric conversion system 8 also includes a distance acquisition unit 803 that calculates the distance to a target object based on the calculated parallax, and a collision determination unit 804 that determines whether there is a collision likelihood, based on the calculated distance. The parallax acquisition unit 802 and the distance acquisition unit 803 serve as an example of a distance information acquisition unit that acquires distance information regarding the distance to a target object. That is, the distance information is information regarding a parallax, a defocus amount, and the distance to a target object. The collision determination unit 804 may determine a collision likelihood using any of these pieces of distance information.

The distance information acquisition unit may be realized with dedicatedly-designed hardware, or may be realized with a software module. Alternatively, the distance information acquisition unit may be realized with a Field Programmable Gate Array (FPGA) or an ASIC, or a combination of these.

The photoelectric conversion system 8 is connected to a vehicle information acquisition apparatus 810, and can acquire vehicle information, such as a vehicle speed, a yaw rate, and/or a steering angle. In addition, a control electronic control unit (ECU) 820 is connected to the photoelectric conversion system 8. The ECU 820 serves as a control device that outputs a control signal for generating a braking force, to the vehicle based on a determination result obtained by the collision determination unit 804.

The photoelectric conversion system 8 is also connected to an alarm apparatus 830 that raises an alarm to a driver based on a determination result obtained by the collision determination unit 804. For example, if the determination result obtained by the collision determination unit 804 indicates a high collision likelihood, the control ECU 820 performs vehicle control for avoiding collision or reducing damage by braking, releasing an accelerator, or suppressing engine output. The alarm apparatus 830 issues an alarm to a user by sounding an alarm, such as sound, displaying warning information on a screen of a car navigation system, or vibrating a seat belt or a steering wheel.

In the present exemplary embodiment, the photoelectric conversion system 8 captures images of the periphery of the vehicle, such as in front of or behind of the vehicle, for example.

Figure 9C:
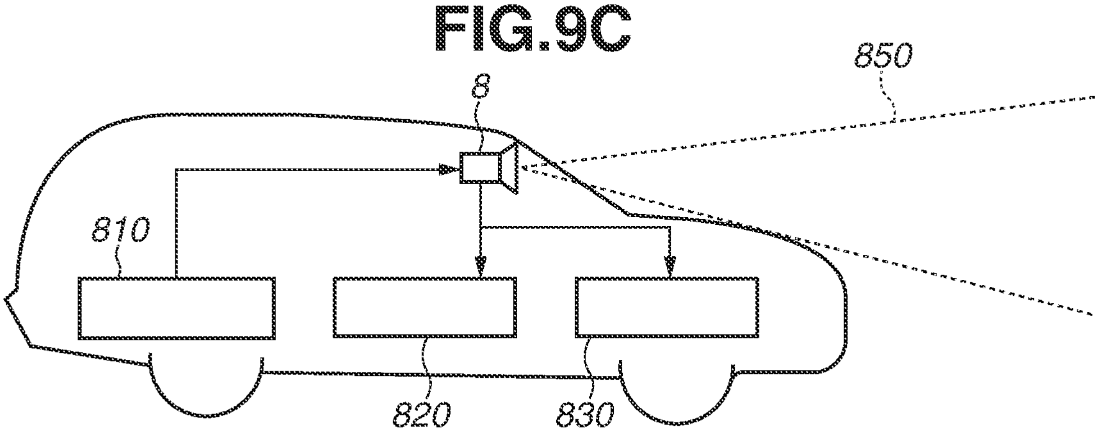

FIG. 9C illustrates a photoelectric conversion system for capturing images ahead of the vehicle (imaging range 850). The vehicle information acquisition apparatus 810 issues instructions to the photoelectric conversion system 8 or the photoelectric conversion apparatus 80. Such a configuration can enhance the accuracy of distance measurement.

The above description has been given of the example in which control is performed to avoid the collision with other vehicles. The photoelectric conversion system can also be applied to the control for performing automatic operation by following another vehicle, or the control for performing automatic operation to avoid going outside a lane. Furthermore, the photoelectric conversion system can be applied to a movable body (moving device), such as a vessel, an aircraft, or an industrial robot aside from a vehicle, such as an automobile. Moreover, the photoelectric conversion system can be applied to a device that extensively uses object recognition, such as an intelligent transport system (ITS), in addition to a movable body.

Modified Exemplary Embodiment

The disclosure is not limited to the above-described exemplary embodiments, and various modifications can be made.

For example, an example in which a partial configuration of any of the exemplary embodiments is added to another exemplary embodiment, and an example in which a partial configuration of any of the exemplary embodiments is replaced with a partial configuration of another exemplary embodiment are also included in the exemplary embodiments of the disclosure.

The above-described photoelectric conversion system described in the third exemplary embodiment merely indicates an example of the photoelectric conversion system to which the photoelectric conversion apparatus can be applied. The configuration to which the photoelectric conversion apparatus of the disclosure can be applied is not limited to the configuration illustrated in FIG. 9A to 9C.

All the above-described exemplary embodiments merely indicate specific examples in embodying the disclosure. The technical scope of the disclosure is not to be construed in a limited manner based on these. That is, the disclosure can be implemented in various forms without departing from the technical idea thereof or the main characteristics thereof.

The disclosure in this specification includes not only the details described in this specification but also the details identifiable from the drawings accompanying this specification.

According to the present disclosure, it is possible to provide a photoelectric conversion apparatus with a reduced warpage of at least one of a plurality of substrates bonded by Cu—Cu connection.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2023-040176, filed Mar. 14, 2023, and No. 2023-212823, filed Dec. 18, 2023, which are hereby incorporated by reference herein in their entirety.

What is claimed is:

1. A photoelectric conversion apparatus comprising:

a first substrate; and a second substrate, wherein a first wiring structure, a first silicon nitride film, a first insulating layer, and a first junction electrode are disposed between the first substrate and the second substrate, wherein a bottom portion of the first junction electrode and a wiring layer closest to the bottom portion of the first junction electrode among wiring layers included in the first wiring structure are electrically connected with a first junction via, wherein a second wiring structure, a second silicon nitride film, a second insulating layer, and a second junction electrode are disposed between the first junction electrode and the second substrate, wherein a bottom portion of the second junction electrode and a wiring layer closest to the bottom portion of the second junction electrode among wiring layers included in the second wiring structure are electrically connected with a second junction via, wherein the first junction electrode and the second junction electrode are bonded on a bonded surface, and the first insulating layer and the second insulating layer are bonded on the bonded surface, and wherein the first silicon nitride film is disposed between the first wiring structure and the bonded surface, the second silicon nitride film is disposed between the second wiring structure and the bonded surface, and the first silicon nitride film and the second silicon nitride film differ in compression stress.

2. The photoelectric conversion apparatus according to claim 1, wherein a first silicon oxide film is disposed between the first wiring structure and the first silicon nitride film, wherein a second silicon oxide film is disposed as the first insulating layer between the first silicon nitride film and the bonded surface, wherein a third silicon oxide film is disposed between the second silicon nitride film and the second wiring structure, and wherein a fourth silicon oxide film is disposed as the second insulating layer between the bonded surface and the second silicon nitride film.

3. The photoelectric conversion apparatus according to claim 2, wherein at least part of the second junction electrode is disposed inside the third silicon oxide film.

4. The photoelectric conversion apparatus according to claim 1, wherein at least part of the second junction electrode is disposed inside the second silicon nitride film.

5. The photoelectric conversion apparatus according to claim 4, wherein a distance from a surface of the second substrate that is closer to the first substrate, to the bottom portion of the second junction electrode is longer than a distance from the surface of the second substrate that is closer to the first substrate, to a surface of the second silicon nitride film that is closer the second substrate.

6. The photoelectric conversion apparatus according to claim 5, wherein a distance from a bottom surface of the second junction electrode to the surface of the second silicon nitride film that is closer to the second substrate ranges from 50 nm to 600 nm, inclusive.

7. The photoelectric conversion apparatus according to claim 6, wherein a distance from the bottom surface of the second junction electrode to the surface of the second silicon nitride film that is closer to the second substrate ranges from 90 nm to 600 nm, inclusive.

8. The photoelectric conversion apparatus according to claim 4, wherein the second silicon nitride film is disposed between the bottom portion of the second junction electrode and the bonded surface.

9. The photoelectric conversion apparatus according to claim 1, wherein the second silicon nitride film has a thicker film thickness than that of the first silicon nitride film.

10. The photoelectric conversion apparatus according to claim 1, wherein the second silicon nitride film has higher compression stress than that of the first silicon nitride film.

11. The photoelectric conversion apparatus according to claim 1, wherein the second silicon nitride film has a higher content density of Si—N bond than that of the first silicon nitride film.

12. The photoelectric conversion apparatus according to claim 1, wherein the second silicon nitride film has a higher film density than that of the first silicon nitride film.

13. The photoelectric conversion apparatus according to claim 1, wherein the first silicon nitride film has a higher content density of hydrogen bond than that of the second silicon nitride film.

14. The photoelectric conversion apparatus according to claim 1, wherein the number of wiring layers included in the second wiring structure is larger than the number of wiring layers included in the first wiring structure, and wherein the second silicon nitride film has higher compression stress than that of the first silicon nitride film.

15. The photoelectric conversion apparatus according to claim 1, wherein the number of wiring layers included in the first wiring structure is larger than the number of wiring layers included in the second wiring structure, and wherein the first silicon nitride film has higher compression stress than the second silicon nitride film.

16. The photoelectric conversion apparatus according to claim 1, wherein wiring layers included in the first wiring structure include an insulating film and a conductor layer, and wherein the insulating film includes a silicon oxide film.

17. The photoelectric conversion apparatus according to claim 1, wherein wiring layers included in the second wiring structure include an insulating film and a conductor layer, and wherein the insulating film includes carbon-doped hydrogenated silicon oxide (SiOCH).

18. The photoelectric conversion apparatus according to claim 1, wherein a photodiode is disposed on the first substrate, and wherein a signal processing circuit configured to perform signal processing on a signal that is based on an output of the photodiode is disposed on the second substrate.

19. A device comprising:

the photoelectric conversion apparatus according to claim 1, wherein the device further includes at least any of:

an optical device compatible with the photoelectric conversion apparatus;

a control device configured to control the photoelectric conversion apparatus;

a processing device configured to process a signal output from the photoelectric conversion apparatus;

a display device configured to display information obtained by the photoelectric conversion apparatus;

a storage device configured to store information obtained by the photoelectric conversion apparatus; and a mechanical device configured to operate based on information obtained by the photoelectric conversion apparatus.

* * * * *